United States Patent
Rodnick

(10) Patent No.: US 8,731,718 B2
(45) Date of Patent: May 20, 2014

(54) DUAL SENSING END EFFECTOR WITH SINGLE SENSOR

(75) Inventor: Matthew J. Rodnick, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 719 days.

(21) Appl. No.: 12/910,342

(22) Filed: Oct. 22, 2010

(65) Prior Publication Data

US 2012/0101633 A1 Apr. 26, 2012

(51) Int. Cl.
  *G05B 19/04* (2006.01)
  *G05B 19/18* (2006.01)

(52) U.S. Cl.
  USPC .......... 700/253; 700/245; 700/258; 700/259; 318/568.11; 318/568.12; 318/568.16; 318/568.21

(58) Field of Classification Search
  USPC ......... 700/245, 248, 249, 250, 258, 259, 260, 700/261, 262, 263, 264, 900; 414/416.03, 414/416.08, 744.5, 937; 73/865.8; 451/8, 451/443; 294/185, 907; 318/568.11, 318/568.12, 568.16, 568.2, 568.21
  See application file for complete search history.

(56) References Cited

U.S. PATENT DOCUMENTS

| | | | | |
|---|---|---|---|---|
| 4,895,486 A * | 1/1990 | Baker et al. | | 414/331.15 |
| 5,177,563 A * | 1/1993 | Everett et al. | | 356/621 |
| 6,160,265 A * | 12/2000 | Bacchi et al. | | 250/559.29 |
| 6,256,555 B1 | 7/2001 | Bacchi et al. | | |
| 6,299,404 B1 * | 10/2001 | Muka et al. | | 414/744.5 |
| 6,481,956 B1 * | 11/2002 | Hofmeister | | 414/806 |
| 6,632,065 B1 | 10/2003 | Cameron et al. | | |
| 6,898,487 B2 * | 5/2005 | Bacchi et al. | | 700/275 |
| 7,540,799 B1 | 6/2009 | Trojan | | 451/8 |
| 7,641,247 B2 | 1/2010 | Blonigan et al. | | 294/1.1 |
| 8,112,177 B2 * | 2/2012 | Adachi et al. | | 700/250 |
| 8,167,521 B2 * | 5/2012 | Nakao et al. | | 414/172 |
| 8,167,522 B2 * | 5/2012 | Duhamel et al. | | 414/217 |
| 8,197,177 B2 * | 6/2012 | van der Meulen et al. | | 414/805 |
| 8,215,890 B2 * | 7/2012 | Tseng et al. | | 414/274 |
| 2005/0229725 A1 | 10/2005 | Dvir | | |
| 2005/0281661 A1 | 12/2005 | Kesil et al. | | |

OTHER PUBLICATIONS

PCT International Search Report and Written Opinion of the International Searching Authority (ISA) issued in International Application No. PCT/IB 11/54350, United States Patent and Trademark Office, May 8, 2012.

* cited by examiner

*Primary Examiner* — Khoi Tran
*Assistant Examiner* — Jaime Figueroa
(74) *Attorney, Agent, or Firm* — Martine Penilla Group, LLP

(57) ABSTRACT

Systems, methods, and computer programs are presented for an end effector with a dual optical sensor. One end effector includes an arm, a mapping sensor, and a load sensor. The arm has one end connected to a pivoting joint, and a light signal is routed around the arm through a single light path. The mapping sensor is used for identifying the presence of the wafer when the wafer is not loaded on the end effector. The load sensor is used for identifying presence of the wafer on the end effector when the wafer is loaded on the end effector. The load sensor is defined by a second segment in the single light path such that the wafer intersects the second segment and interferes with the single light path when the wafer is loaded. A control module determines if an interruption in the single light path corresponds to an interruption of the single light path in the mapping sensor or the load sensor. As a result, one single light sensor is used to sense for two different conditions in the end effector.

18 Claims, 8 Drawing Sheets

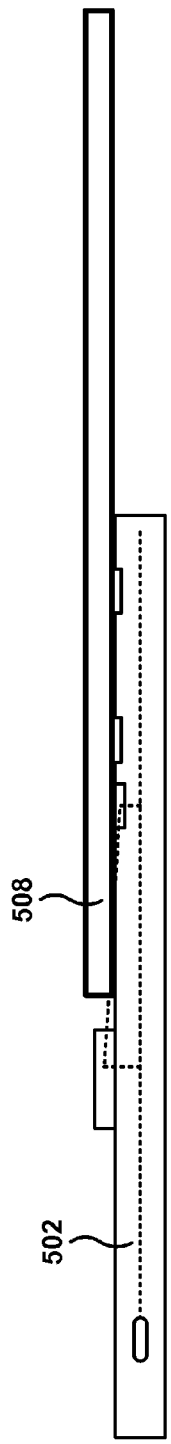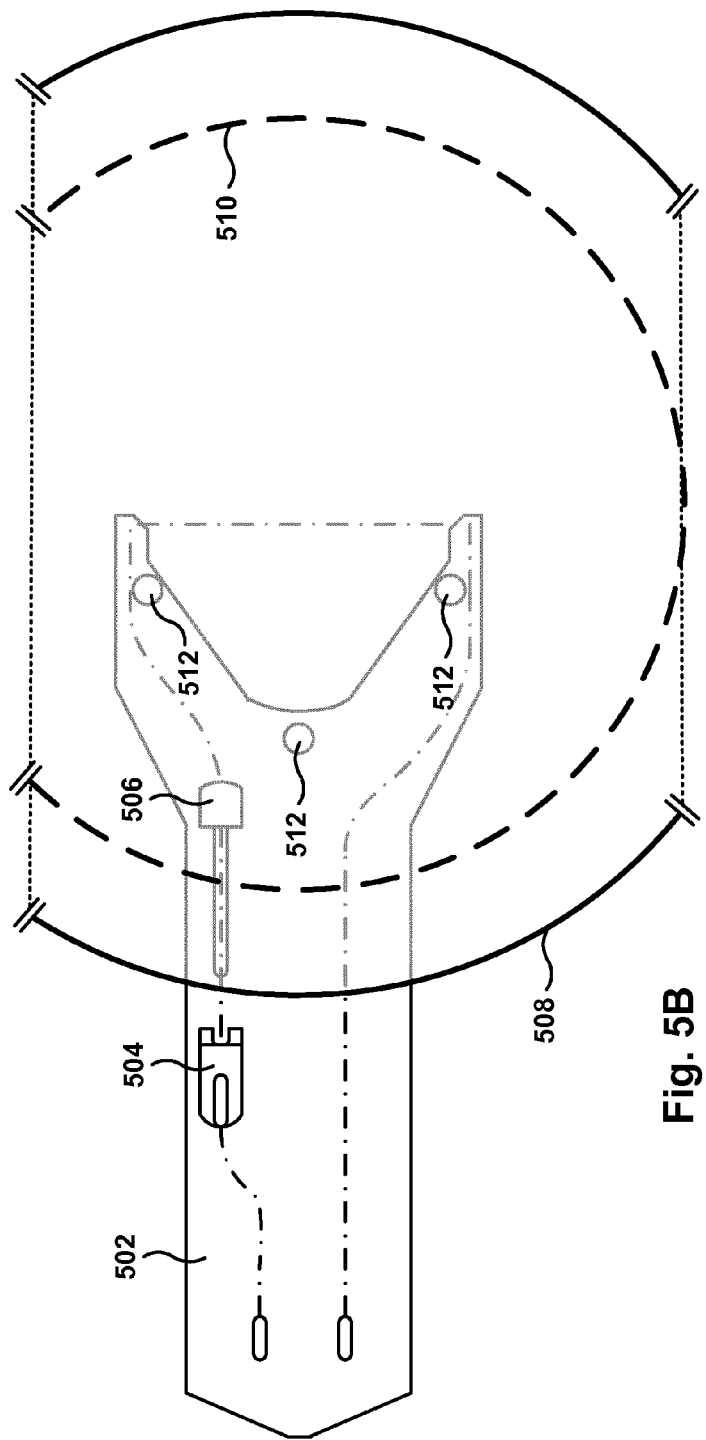
Fig. 5A
Fig. 5B

DUAL SENSING END EFFECTOR WITH SINGLE SENSOR

BACKGROUND

1. Field of the Invention

The present invention relates to systems, methods, and computer programs for detecting wafer location, and more particularly, systems, methods and computer programs for detecting wafer location using optical sensors on wafer handling robots, and if the wafer is present in a correct orientation before and after the end effector contacts a wafer.

2. Description of the Related Art

An end effector is a device or tool that's connected to the end of a robot arm. The end effector is the part of the robot that interacts with the environment. In semiconductor manufacturing, some end effectors are employed to transport semiconductor wafers between different locations, such as transporting wafers from an alignment station to an etching station, or between wafer storage and tools.

When transporting semiconductor wafers via a robotic arm end effector, various sensors can be built into the end effector structure. The sensors can detect if the wafer has slipped, shifted, or if the wafer has been properly loaded in the end effector and is in a safe transfer location. Prior to transporting wafers via robotic arm end effector, the wafer's location in a holder maybe determined with additional sensors built into the end effector to "map" wafer location. In some end effectors, two separate sensors with supporting electronics and power consumption are typically placed in the end effector to locate and transport safely a wafer via the robotic arm. Thus, an end effector may have to perform two separate detection functions: presence and mapping.

It is in this context that embodiments of the invention arise.

SUMMARY

Embodiments of the present invention provide systems, methods, and computer programs for an end effector that has a dual sensor for detecting presence of a wafer.

It should be appreciated that the present invention can be implemented in numerous ways, such as a process, an apparatus, a system, a device or a method on a computer readable medium. Several inventive embodiments of the present invention are described below.

In one embodiment, an end effector includes an arm, a mapping sensor, and a load sensor. The arm has a first end and a second end, where the first end is connected to a pivoting joint. A first point and a second point are defined at the second end, and a light signal is routed around the arm through a single light path. Further, the mapping sensor is used for identifying the presence of the wafer between the first point and the second point when the wafer is not loaded on the end effector. The mapping sensor is defined by a first segment in the single light path such that the wafer intersects the first segment and interferes with the single light path when the wafer is situated between the first point and the second point and the wafer is not loaded on the end effector. The load sensor is used for identifying presence of the wafer between the first end and the second end when the wafer is loaded on the end effector. The load sensor is defined by a second segment in the single light path such that the wafer intersects the second segment and interferes with the single light path when the wafer is loaded. A control module determines if an interruption in the single light path corresponds to an interruption of the single light path in the first segment or in the second segment. As a result, one single light sensor is used to sense for two different conditions in the end effector.

In another embodiment, a method for detecting presence of a wafer by an end effector includes an operation for routing a light signal through a single light path around an arm of an end effector. The arm has a first end and a second end, where a first point and a second point are defined at the second end. The method includes an operation for detecting interference with the light signal in a mapping sensor when the wafer is between the first point and the second point and the wafer is not loaded on the end effector. The mapping sensor is defined by a first segment in the single light path such that the wafer intersects the first segment and interferes with the single light path when the wafer is situated between the first point and the second point and not loaded on the end effector. Further, the method includes another operation for detecting interference with the light signal in a load sensor when the wafer is between the first end and the second end and the wafer is loaded on the end effector. The load sensor is defined by a second segment in the single light path such that the wafer intersects the second segment and interferes with the single light path when the wafer is loaded. A control module determines if an interruption in the single light path corresponds to an interference with the light signal in the mapping sensor or in the load sensor.

In yet another embodiment, a computer program embedded in a non-transitory computer-readable storage medium, when executed by one or more processors, for detecting presence of a wafer by an end effector, is presented. The computer program includes program instructions for routing a light signal through a single light path around an arm of an end effector. The arm has a first end and a second end, where a first point and a second point are defined at the second end. The computer program further includes program instructions for detecting interference with the light signal in a mapping sensor when the wafer is between the first point and the second point and the wafer is not loaded on the end effector. The mapping sensor is defined by a first segment in the single light path such that the wafer intersects the first segment and interferes with the single light path when the wafer is situated between the first point and the second point and not loaded on the end effector. Additionally, the computer program includes program instructions for detecting interference with the light signal in a load sensor when the wafer is between the first end and the second end and the wafer is loaded on the end effector. The load sensor is defined by a second segment in the single light path such that the wafer intersects the second segment and interferes with the single light path when the wafer is loaded. Additional program instructions for a control module determine if an interruption in the single light path corresponds to an interference with the light signal in the mapping sensor or in the load sensor.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which:

FIGS. 5A-5B present side and top view of an end effector with a loaded wafer, according to one embodiment.

DETAILED DESCRIPTION

Provided are systems, methods, and computer programs for an end effector with a dual optical sensor to detect presence of a wafer. In one embodiment, an end effector includes an arm, a mapping sensor, and a load sensor. The arm has a first end and a second end, where the first end is connected to a pivoting joint. A first and a second point are defined at the second end, and a light signal is routed around the arm through a single light path. Further, the mapping sensor is used for identifying the presence of the wafer between the first point and the second point when the wafer is not loaded on the end effector. The mapping sensor is defined by a first segment in the single light path such that the wafer intersects the first segment and interferes with the single light path when the wafer is situated between the first point and the second point and the wafer is not loaded on the end effector. The load sensor is used for identifying presence of the wafer between the first end and the second end when the wafer is loaded on the end effector. The load sensor is defined by a second segment in the single light path such that the wafer intersects the second segment and interferes with the single light path when the wafer is loaded. A control module determines if an interruption in the single light path corresponds to an interruption of the single light path in the first segment or in the second segment. As a result, one single light sensor is used to sense for two different conditions in the end effector.

It will be obvious, however, to one skilled in the art, that the present invention may be practiced without some or all of these specific details. In other instances, well known process operations have not been described in detail in order not to unnecessarily obscure the present invention.

Figure 1:
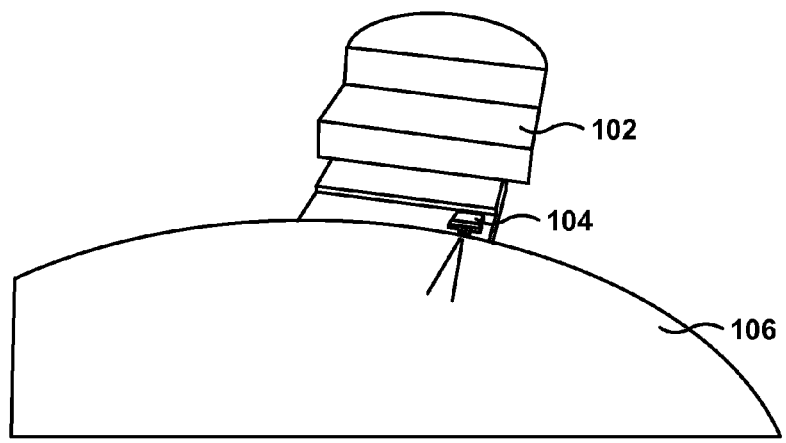
FIG. 1 illustrates an optic sensor in an end effector for determining the presence of a wafer, according to one embodiment.

FIG. 1 illustrates an optic sensor in an end effector for determining the presence of a wafer, according to one embodiment. Embodiments of the invention utilize a single digital fiber optic sensor to sense two different conditions, i.e., two different wafer locations. The single digital fiber optic sensor includes a light emitter, a light receiver, and a digital output. The fiber optic beam path is routed through two geometric gaps that enable a wafer to interrupt the beam when loaded on the end effector or when being mapped outside the end effector. Substrate mapping as used herein, also referred to herein as "wafer mapping," is a process in which the robot with the end effector "maps" or locates the location of one or more wafers when the wafers are not located on the end effector. For example, the wafers may be inside a Front Opening Unified Pod (FOUP) and the mapping function is performed to determine if the wafers are properly seated in the FOUP. This mapping information is useful to the robot that transports the wafers, for example to make sure that the wafer is in the expected location before loading the wafer in the end effector.

A computer program analyzes the information from the single digital fiber optic sensor depending on the information being performed by the robot. Thus, if the robot is loading a wafer, an interruption or interference with the light beam is interpreted as the loaded wafer causing the interference on the light path, and if the robot is performing a mapping function, an interruption of the light beam is interpreted as being caused by a wafer being mapped outside the end effector load area. Thus, one sensor is used for two functions, reducing the number of sensors and associated components.

FIG. 1 illustrates the detection of loaded wafer 106 by the presence sensor 104 in robot arm 102. The presence sensor has a vertical component such that the presence sensor determines if there is an interruption to the light path between a point above the surface of the loaded wafer and a point below the loaded wafer 106.

Figure 2A:
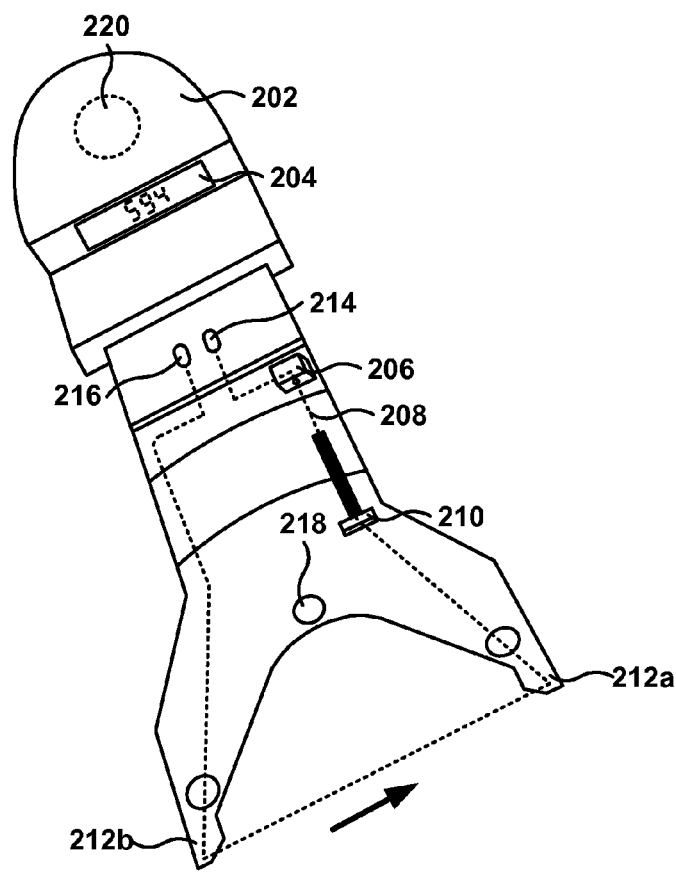
FIGS. 2A-2B depicts an embodiment of an end effector with dual optical sensing capability.
Figure 2B:
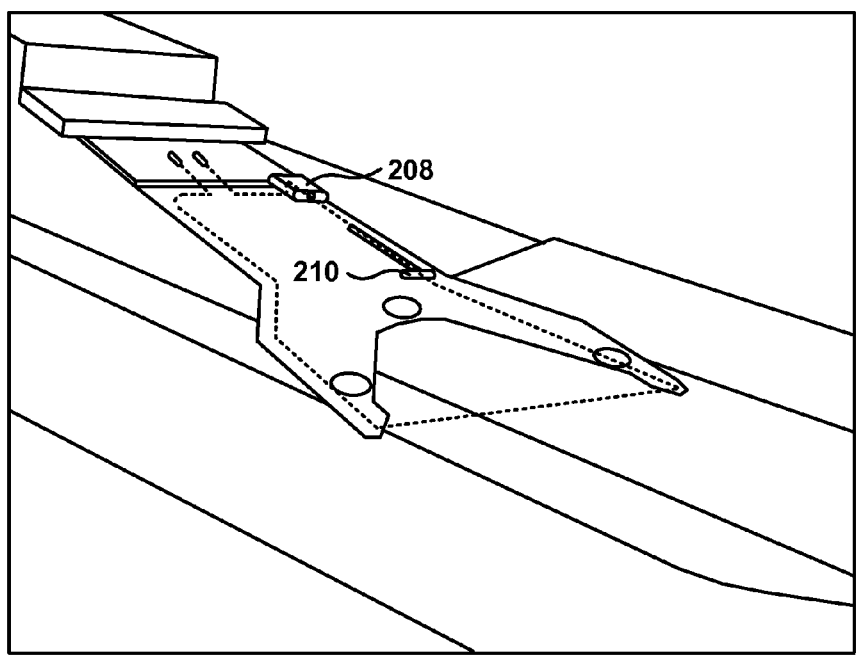

FIGS. 2A-2B depicts an embodiment of an end effector with dual optical sensing capability. Robot arm 202 includes a pivot point 220 connected to a robot structure that allows the robot arm 202 to pivot around pivot point 220. Light emitter 216 provides the light source for light path 208, which comprises two sensing gaps and ends in light receiver 214. The first gap is defined between points 212a and 212b located at one end of the blade in the end effector. The light is routed from light emitter 216 to point 212b through an optical conduit that may include and optical cable as well as other optical elements, such as mirrors, optical amplifiers, focus lenses, etc.

From point 212a the light path continues to focus lens 210, which is the beginning of the second gap used for presence sensing. The second gap ends at focus lens 206. It should be noted that the second gap has a vertical component because the first end of the gap is below the surface of a loaded wafer and the second end is above the loaded wafer. From focus lenses 206, the light path continues to light receiver 214. In one embodiment, the amount of light received by light receiver 214 is measured and displayed in quantified form at display 204. FIG. 2B presents a different viewing angle for the end effector in FIG. 2A.

In one embodiment, a focus lens in the light path contains a light amplifier to improve the amount of light detected by the sensor. During calibration the amount of light received by the light receiver is measured when the light path is free of obstructions. In normal operation the amount of light received may fluctuate due to different factors, such as ambient light, dust, temperature, etc. A trip point is defined, such that an amount of light received below the trip point is interpreted as a block in the light path to indicate that a sensor has been triggered, and an amount of light received above the trip point is interpreted as a lack of interference with the light path.

In one embodiment, one or more vacuum sensors 218 identify when the wafer is properly loaded on the end effector using the suction effect on the vacuum sensor. In another embodiment, a second trip point is defined for the vacuum sensor to define the boundaries between detecting a wafer properly loaded in the end effector and a wafer that is not properly loaded.

It should be noted that the embodiment illustrated in FIGS. 2A and 2B are exemplary. Other embodiments may route the light in the opposite direction, have a different geometric profile for the light path, avoid the use of focus lenses, have a different robot structure, etc. The embodiments illustrated in should therefore not be interpreted to be exclusive or limiting, but rather exemplary or illustrative.

Embodiments of the invention include two different gaps in a single light path with a single light source. The result is a sensor with dual sensing capability. Using two different sensors would require additional components in the end effector with the added complexity and cost.

Figure 3:
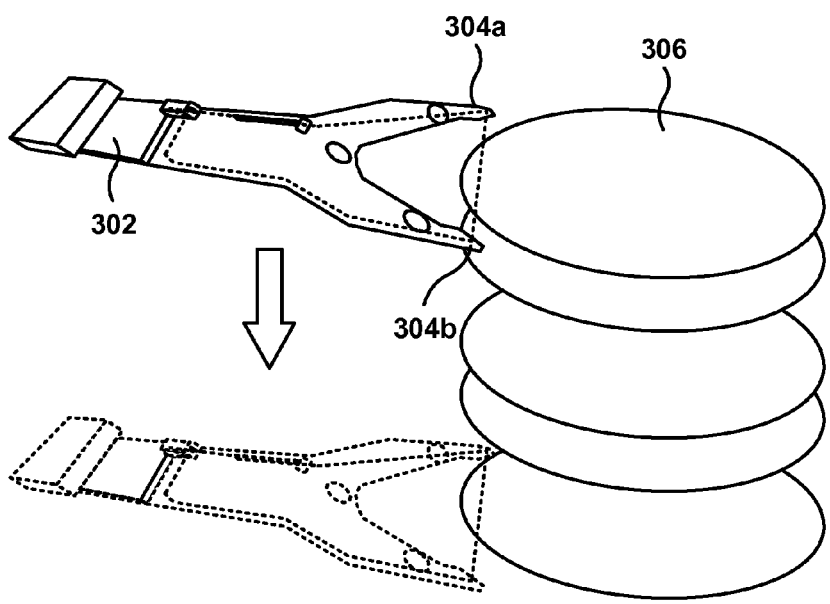
FIG. 3 illustrates an end effector performing a mapping for a group of wafers, according to one embodiment.

FIG. 3 illustrates an end effector performing a mapping for a group of wafers, according to one embodiment. As the end effector travels in a vertical direction, the edge of wafer 306 interrupts the light beam passing through the end effector fiber optic. This interruption takes place when the wafer is between points 304a and 304b, known as the mapping segment gap. As the light is interrupted, the light receiver detects no light, and returns a state of "off" to a robot control system. The robot control system uses this "off" state in conjunction with the internal position of the end effector to record the location of the wafer. When no wafer edge interrupts the light beam the light passes through the mapping segment gap (and the present segment gap) to return to the light receiver, which delivers a state of "on". The robot control system uses the "on" state in conjunction with its internal position system to record that the location has no wafer.

Combining the locations that have wafers locations that have no wafers (e.g., in a FOUP) produces a map of the location, which can later be used by the robot to pick up and drop off wafers, or to determine other states, such as wafer offset. The scenario illustrated in FIG. 3 shows how the end effector maps the location of a plurality of wafers as the end effector moves in a vertical direction. As the end effector travels vertically, the end effector maps the location of the wafers detected in the vertical swap.

In one embodiment, the end effector starts the mapping function in a location in front of the location where the substrates are expected. For example, if a substrate is improperly situated in a loading station and the wafer is "sticking out" away from the station, the end effector could collide with the wafer while traveling to perform the mapping function, as the robot is not expecting the wafer in that improper location. To detect this situation, the end effector does a series of vertical maps separated by a certain amount of horizontal spacing until the end effector detects the presence of a wafer. In one embodiment, the initial mapping passes are performed at a high speed, until the end effector detects a wafer. If a wafer is detected in a "sticking out" position, the robot end effector is commanded to stop to facilitate a recovery action to re-seat the wafer in a corrected location.

Figure 4A:
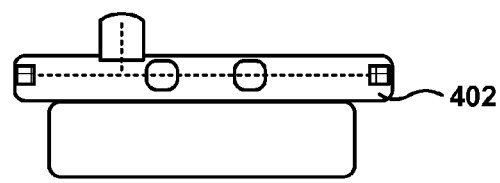
FIGS. 4A-4C present front, top, and side views of an end effector with a dual optical sensor, in accordance with one embodiment of the invention.
Figure 4B:
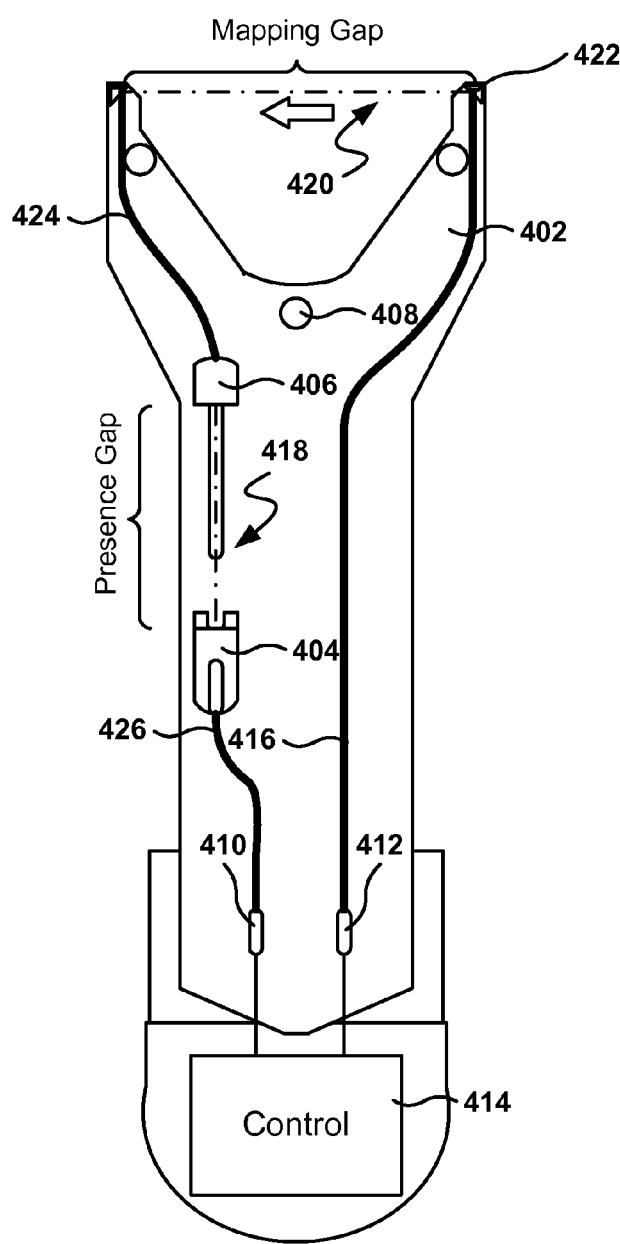
Figure 4C:
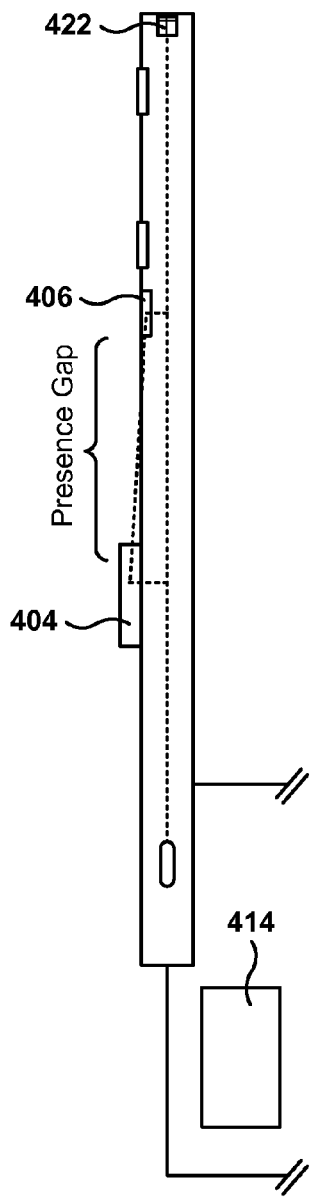

FIGS. 4A-4C present front, top, and side views of an end effector with a dual optical sensor, in accordance with one embodiment of the invention. End effector structural material 402 typically has the shape of a paddle and is used to pick up wafers. The end effector is attached to the end of a robotic arm, housing light emitter 412 and light receiver 410 that form a fiber optic light sensor. The end effector can be any shape as to fulfill the function to pick up, drop off, and transport a wafer between locations.

Fiber optic lines 416, 424, and 426 are routed within the end effector structure to complete the light path loop. The light path includes presence gap 418 and mapping gap 420, and may include other optical elements to route the light, such as minor 422, focus lens 406, amplifier focus lens 404, etc. Light is unobstructed through the fiber optic path when no wafer or other obstruction is in the light path. A small amount of light can be lost in the presence gap, which is why amplifier focus lens 404 enables the amplification of the light signal to avoid a weak signal at light received 410. The optic lines may be exposed or may be hidden within the arm of the end effector.

Light source emitter 412 can be any light source that can be detected by a compatible receiver. For example, the light source can be a Light-Emitting Diode (LED), laser, infrared, etc. Either side of the end effector can have the emitter or the receiver as the direction of the light does not affect the results. FIG. 4B shows light emitter 412 on the right side, but in another embodiment, light emitter 412 is situated on the left side. Light receiver 410 is a light detector that converts the sensed light into either an "on" state (no light received) or an "off" state (light received), as previously discussed. The trip point for the amount of light received is defined to determine when to output an "on" or an "off" state. Additionally, a threshold amount of time may be set such that small transitory variations below the threshold time will not cause a change in the output of the sensor.

Mapping gap 420, also referred to as the mapping beam segment, is a gap in the fiber optic path that is unprotected or unshielded. An object placed in mapping gap 420 will block the light beam going through the light path. As the robot arm moves the end effector by a wafer's edge, such that the wafer's edge is located in the mapping gap 420, the light beam is blocked causing an "off" state by the robot's position system. This indicates that a wafer has been located.

Presence gap 418, also referred to as the present beam segment, is a gap in the fiber optic path that is unprotected or unshielded. An object placed in mapping gap 418 will block the light beam going through the light path. As the robot arm moves the end effector to pick up a wafer, the wafer's edge blocks the light beam, and an "off" state is registered with the robot's position system, thus registering that a wafer has been successfully picked up.

In one embodiment, the light path is substantially horizontal throughout, except for presence gap 418. As seen in FIG. 4C, the light path in the presence gap has a vertical component and intersects the horizontal plane at an angle bigger than 0. Thus, the end points of the presence gap are below the loaded wafer and above the loaded wafer, respectively. Amplifier focus lens 404, routes the light back towards the horizontal plane, before the light reaches light receiver 410 thorough optic line 426.

Since the mapping function occurs without a wafer located on the end effector structure, and the wafer present function occurs as part of wafer transport, these two functions can share the output of the fiber optic sensor without conflict. Control module 414 is in communication with light emitter 412 and light receiver 410, as well as with the control program for the robot. When there is an obstruction in the light path, control module 414 determines in which gap the obstruction is taking place, according to the present function of the robot. Thus, when the robot is performing a mapping function to locate the edge of wafers in storage, the control module will attribute the light block to the mapping gap. On the other hand, when the end effector has (or the system beliefs that it should have) a loaded wafer, or when the end effector is in the process of picking up the wafer, a block in the light path will be attributed to a block in the presence gap. It should be noted that although the control module of FIG. 4B is located in the arm of the robot, the control module, or the functions associated with the control module, may reside in other parts of the robot or the semiconductor manufacturing facility. Vacuum sensor 408 is used for determining if a wafer has been properly loaded on the end effector.

FIGS. 5A-5B present side and top view of an end effector with a loaded wafer, according to one embodiment. When sensing wafer presence on end effector 502, wafer 508 interrupts the light beam passing through the end effector fiber optics and the present segment gap (between optic elements 506 and 504). When the light is interrupted, the light receiver detects no light and returns a state of "off." The present beam segment gap can be placed into different locations on the end effector structure, as long as the wafer's edge interrupts the beam when the wafer is at the desired pickup location on the structure. In one embodiment, the presence gap is designed to detect wafers of multiple sizes. For example, the embodiment in FIG. 5A is able to detect the presence of wafers 508 and 510 of different sizes.

The robot control system uses the "off" state, in conjunction with the internal position system, to record the location of the wafer being picked up or dropped off. If the robot control system expects a wafer in certain location but the location has no wafer, there is no interruption of the light beam by the wafer, and the light passes through the present segment gap (and the mapping segment gap) to end at the light receiver, which returns a state of "on". The robot control system uses the "on" state, in conjunction with the internal position system, to record that the location has a status of "no wafer present." When the control system state is set to pick-up a wafer at a location, and the light receiver state is "on", then an error condition occurs to indicate that the wafer was unsuccessfully picked up, or that the wafer was not in the expected location.

The end effector in FIGS. 5A-5B includes 3 vacuum sensors 512. The vacuum sensors indicate that a wafer is properly located when suction is properly set on the wafer. This way, if suction is detected, then this means that the wafer has been loaded. However, wafers are not always flat. If vacuum sensors are used without the optical presence sensor, when vacuum sensors 512 can't obtain proper suction, then the system determines that the wafer has not been loaded properly and the operation of the robot end effector has to stop.

The optical sensor complements the information provided by the vacuum sensors. For example, if the suction fails but the optic sensor shows that the wafer is loaded, then the end effector will determine that there is a wafer loaded, and the end effector will also determine that there is a problem with the wafer or with the position of the wafer on the end effector. In one embodiment, the end effector will move with caution (slowly) in response to the error condition caused by the faulty suction, but the system will not stop operations.

When both sensors show a proper load of the wafer, then the end effector does not need to operate cautiously and moves at a higher speed. If both sensors indicate that there is no suction and no optical presence, then the wafer will not be transported. An error condition is generated to be processed by the semiconductor processing logic. Table 1 below illustrates the movement of the end effector based on status from the optical sensor and the vacuum sensor.

TABLE 1

| Vacuum Sensor Status | Optical Sensor Status | End Effector Speed |
| --- | --- | --- |
| Wafer Detected | Wafer Detected | Fast |
| Wafer Detected | Wafer Not Detected | Slow |
| Wafer Not Detected | Wafer Detected | Slow |
| Wafer Not Detected | Wafer Not Detected | Load error (alert operator or other corrective action) |

Figure 5C:
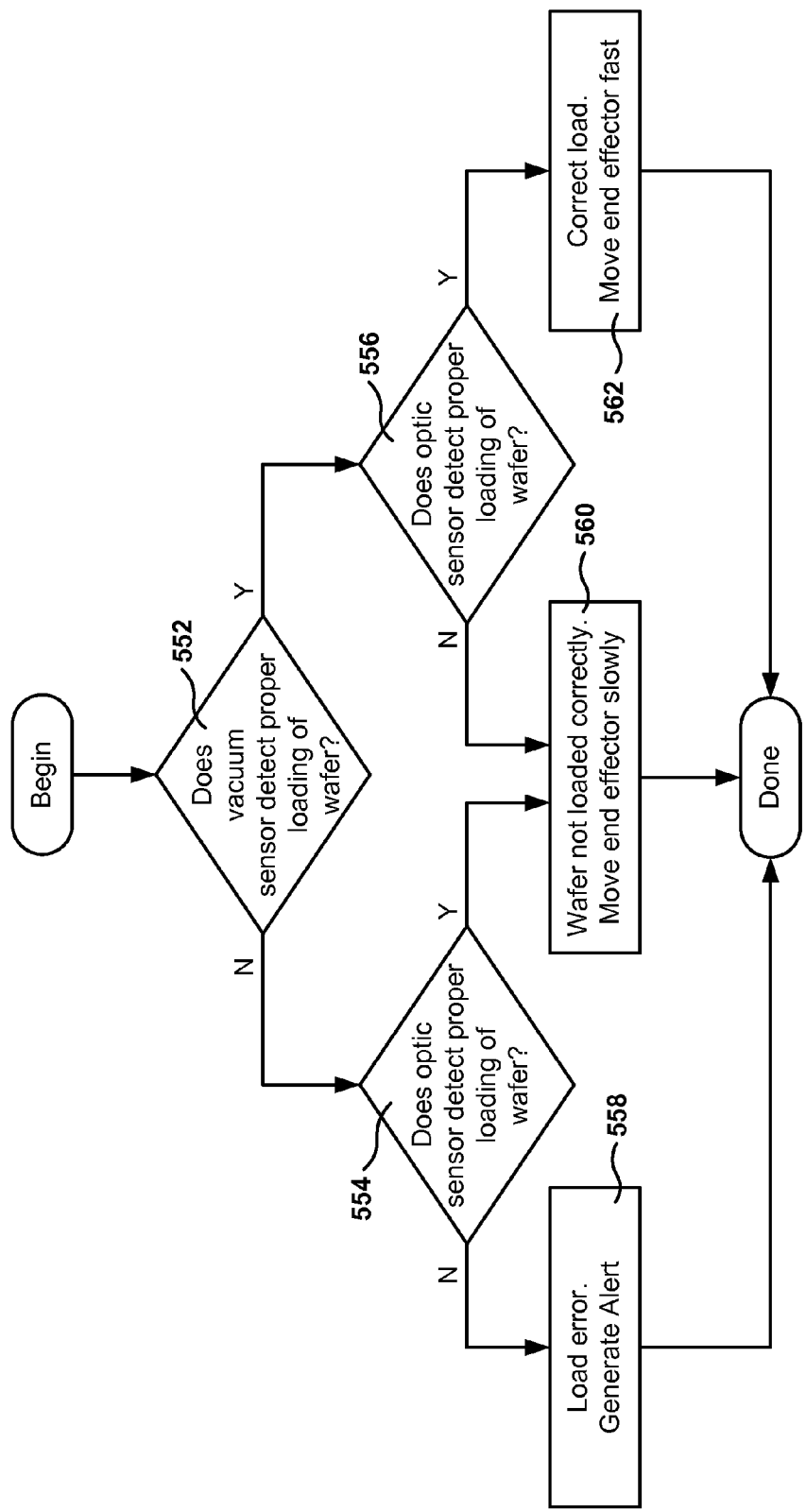
FIG. 5C illustrates a method for determining robot end effector speed based on status received from the vacuum sensor and the optical sensor.

FIG. 5C illustrates a method for determining robot end effector speed based on status received from the vacuum sensor and the optical sensor. In operation 552, the method checks if the vacuum sensor detects proper loading of the wafer on the end effector. If the vacuum sensor detects proper loading, then the method continues to operation 556, or continues to operation 554 otherwise. Further, in operation 554 the method checks if the optic sensor detects a proper loading of the wafer. It the result of the check in operation 554 is that the optic sensor did not detect a proper load, then the method flows to operation 558, or continues to operation 560 otherwise.

As in operation 554, the method checks in operation 556 if the optic sensor detects a proper loading of the wafer, and if the check determines that the wafer is properly loaded then the method continues to operation 562, or to operation 560 otherwise. In operation 558 an error condition is detected, because both sensors have detected that the load of the wafer was not correct. An alert is generated.

In operation 560, the method determines that the wafer was loaded, but it was loaded incorrectly, because one sensor determined proper loading but the other sensor did not detect proper loading. In this case, the end effector moves slowly due to the incorrect loading of the end effector. In operation 556, the method determines that the wafer was properly loaded as both sensors detected a proper loading of the wafer. In this case, the end effector moves at a fast speed (fast when compared to the case when the wafer was improperly loaded) as no extra caution is required in this case.

It should be noted that the embodiment illustrated in FIG. 5C is exemplary. Other embodiments may utilize different tests or perform the tests in different order. The embodiment illustrated in FIG. 5C should therefore not be interpreted to be exclusive or limiting, but rather exemplary or illustrative.

Other types of sensors can be used in conjunction with the optic sensor, such as a mechanical presence sensor, an active grip sensor, an inductive sensor, a proximity sensor, a touch sensor, etc. Shape of end effector can also change and be of many types. In one embodiment, the vacuum sensor is missing and the system relies exclusively on the optic sensor to determine that the wafer has been loaded (or unloaded).

Figure 6:
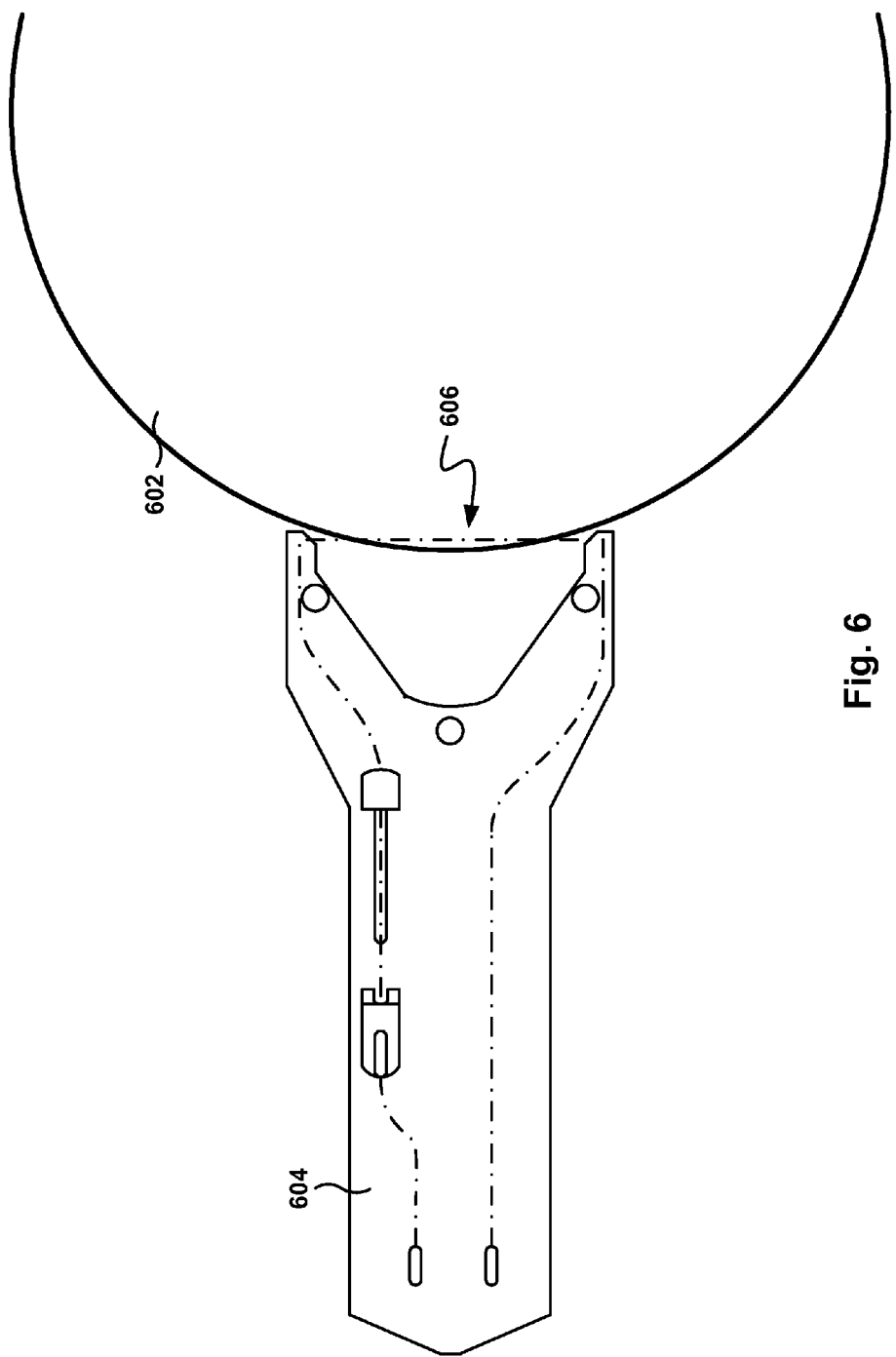
FIG. 6 illustrate the mapping of a wafer by the end effector, according to one embodiment.

FIG. 6 illustrate the mapping of a wafer by the end effector, according to one embodiment. As previously discussed, the mapping sensor is used to map the location of a wafer in front of the end effector. Typically, the robot arm moves in a vertical direction and when the end effector goes by the edge of wafer 602, the light beam is blocked (in mapping gap 606) causing an "off" state by the robots position system. This indicates that a wafer has been located.

Often, a stack of wafers are located in a semiconductor manufacturing station (etching chamber, alignment module, load port, etc.) and the end effector makes a vertical pass to map each of the wafers in the station. For example, the end effector will detect where each wafer is actually located, as well as which slots are empty without a wafer. If a wafer is not seated straight (in a horizontal position), then the beam is interrupted longer as the end effector travels downward. This means that the wafer is not properly seated. The error condition will be flagged causing the wafer to be missed in the next semiconductor operation or requesting some other operator action.

The mapping gap can be designed into any side of the end effector, as long as that side is orientated to be passed by a wafer's edge when the wafer is in a stored location. In one embodiment, mapping gap 606 is not perfectly horizontal, i.e., it has a vertical component although it is close to horizontal. This allows the robot system to get some information about the location of the wafer's edge because the robot can now determine two point's of the wafer's edge as the end effector moves vertically. Thus, when the state of the sensor switches from "on" to "off", a first point in the edge is located, and when the sensor switches from "off" to "on, a second point in the edge is located.

Figure 7:
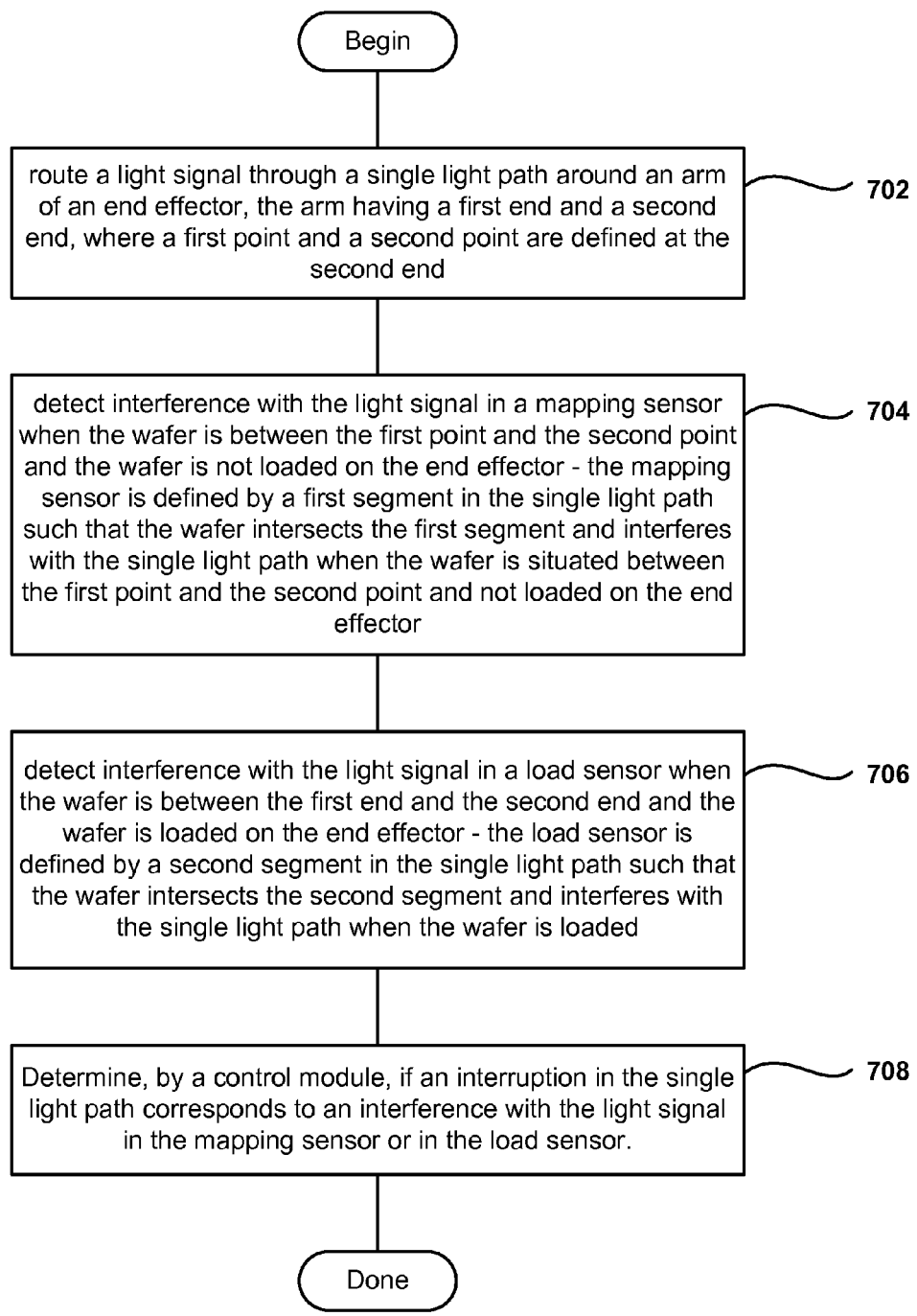
FIG. 7 shows the process flow for detecting presence of a wafer by an end effector with dual optical sensing capabilities, in accordance with one embodiment of the invention.

FIG. 7 shows the process flow for detecting presence of a wafer by an end effector with dual optical sensing capabilities, in accordance with one embodiment of the invention. In operation 702, the method includes routing a light signal through a single light path around an arm of an end effector. The arm has a first end and a second end, where a first point and a second point are defined at the second end of the end effector. See for example a first end by pivot point 220, and a second end by mapping gap delimited by points 212a and 212b in FIG. 2A.

Further, the method includes operation 704 for detecting interference with the light signal in a mapping sensor when the wafer is between the first point and the second point and the wafer is not loaded on the end effector. The mapping sensor is defined by a first segment in the single light path such that the wafer intersects the first segment and interferes with the single light path when the wafer is situated between the first point and the second point and the wafer is not loaded on the end effector.

In operation 706, interference with the light signal is detected in a load sensor when the wafer is between the first end and the second end and the wafer is loaded on the end effector. The load sensor is defined by a second segment in the single light path such that the wafer intersects the second segment and interferes with the single light path when the wafer is loaded. In operation 708, a control module determines if an interruption in the single light path corresponds to an interference with the light signal in the mapping sensor or in the load sensor.

Figure 8:
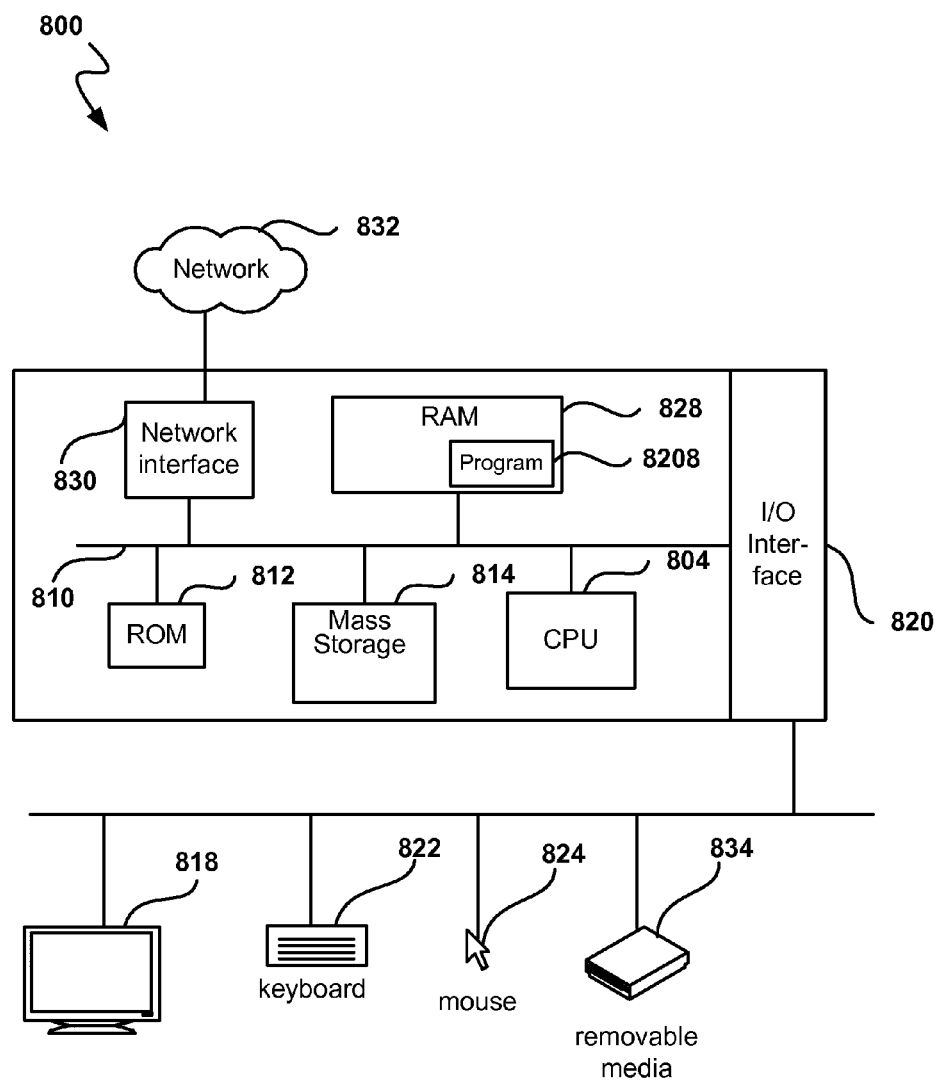
FIG. 8 is a simplified schematic diagram of a computer system for implementing embodiments of the present invention.

FIG. 8 is a simplified schematic diagram of a computer system for implementing embodiments of the present invention. It should be appreciated that the methods described herein may be performed with a digital processing system, such as a conventional, general-purpose computer system. Special purpose computers, which are designed or programmed to perform only one function may be used in the alternative. The computer system includes a central processing unit (CPU) 804, which is coupled through bus 810 to random access memory (RAM) 806, read-only memory (ROM) 812, and mass storage device 814 end effector controller program 808 resides in random access memory (RAM) 806, but can also reside in mass storage 814.

Mass storage device 814 represents a persistent data storage device such as a floppy disc drive or a fixed disc drive, which may be local or remote. Network interface 830 provides connections via network 832, allowing communications with other devices. It should be appreciated that CPU 804 may be embodied in a general-purpose processor, a special purpose processor, or a specially programmed logic device. Input/Output (I/O) interface provides communication with different peripherals and is connected with CPU 804, RAM 806, ROM 812, and mass storage device 814, through bus 810. Sample peripherals include display 818, keyboard 822, cursor control 824, removable media device 834, etc.

Display 818 is configured to display the user interfaces described herein. Keyboard 822, cursor control 824, removable media device 834, and other peripherals are coupled to I/O interface 820 in order to communicate information in command selections to CPU 804. It should be appreciated that data to and from external devices may be communicated through I/O interface 820. The invention can also be practiced in distributed computing environments where tasks are performed by remote processing devices that are linked through a wire-based or wireless network.

Embodiments of the present invention may be practiced with various computer system configurations including handheld devices, microprocessor systems, microprocessor-based or programmable consumer electronics, minicomputers, mainframe computers and the like. The invention can also be practiced in distributed computing environments where tasks are performed by remote processing devices that are linked through a network.

With the above embodiments in mind, it should be understood that the invention can employ various computer-implemented operations involving data stored in computer systems. These operations are those requiring physical manipulation of physical quantities. Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

One or more embodiments of the present invention can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An end effector having a dual sensor for detecting presence of a wafer, comprising:
    an arm having a first end and a second end, the first end being connected to a pivoting joint, a first point and a second point being defined at the second end;
    a light emitter operable to generate a light signal; and
    a light sensor for detecting the light signal after the light signal is routed around the arm through a single light path, the single light path including a first segment and a second segment, the first segment being defined between the first point and the second point, and the second segment intersecting a wafer when loaded on the end effector;

wherein a mapping function of a control module identifies presence of the wafer between the first point and the second point when the wafer is not loaded on the end effector and the wafer intersects the first segment blocking the light signal from reaching the light sensor;

wherein a load function of the control module identifies presence of the wafer between the first end and the second end when the wafer is loaded on the end effector and the wafer intersects the second segment blocking the light signal from reaching the light sensor, wherein the control module determines if an interruption in the light signal corresponds to an interruption in the first segment or in the second segment, wherein the control module determines that the interruption of the single light path is in the first segment when the end effector is performing the mapping function, and the control module determines that the interruption of the single light path is in the second segment when the end effector is performing the load function.

2. The end effector of claim 1, wherein the first segment is substantially horizontal and allows the detection of the wafer when the wafer is in front of the end effector.

3. The end effector of claim 1, wherein the second segment has a vertical component and intersects a horizontal plane at an angle bigger than 0.

4. The end effector of claim 3, wherein the second segment connects a point in the end effector above a loaded wafer and a point in the end effector below a loaded wafer.

5. The end effector of claim 1, further including:
a vacuum sensor that senses when the wafer is loaded in the end effector.

6. The end effector of claim 5, wherein the control module determines that a wafer is properly loaded when the load function and the vacuum sensor indicate proper loading of the wafer, and the control module determines that a wafer is improperly loaded when one of the load function or the vacuum sensor indicates proper loading of the wafer and one of the load function or the vacuum sensor indicates improper loading of the wafer.

7. The end effector of claim 6, wherein the end effector moves at regular speed when the wafer is properly loaded.

8. The end effector of claim 6, wherein the end effector moves at slow speed when the wafer is improperly loaded.

9. The end effector of claim 1, wherein exceeding a threshold value in an amount of interference with the single light path determines that an interruption of the single light path has taken place.

10. A method for detecting presence of a wafer by an end effector, comprising:
generating a light signal by a light emitter;
routing the light signal through a single light path around an arm of an end effector, the single light path ending at a light sensor for detecting presence of the light signal, the arm having a first end and a second end, wherein a first point and a second point are defined at the second end, the single light path including a first segment and a second segment, the first segment being defined between the first point and the second point, and the second segment intersecting a wafer when loaded on the end effector;
detecting interference with the light signal in a mapping function of a control module when the wafer is between the first point and the second point and the wafer is not loaded on the end effector and the wafer intersects the first segment blocking the light signal from reaching the light sensor;
detecting interference with the light signal in a load function of the control module when the wafer is between the first end and the second end and the wafer is loaded on the end effector and the wafer intersects the second segment blocking the light signal from reaching the light sensor; and
determining by a control module if an interruption in the single light path corresponds to an interference with the light signal in the mapping function or in the load function, wherein the mapping function determines that a wafer is not properly situated in a horizontal position before loading the wafer in the end effector when the end effector is moving substantially vertically and the mapping function detects interference with the light signal for an amount of time longer than a time corresponding to a sensor properly placed in a horizontal position.

11. The method as recited in claim 10, wherein the arm of the end effector further includes a second sensor selected from a group consisting of a touch sensor, a vacuum sensor, a mechanical sensor, an active grip sensor, a proximity sensor and an inductive sensor.

12. The method as recited in claim 11, further including:
combining information from two or more sensors to determine if the wafer is properly loaded in the end effector.

13. The method as recited in claim 10, wherein the light emitter is a light emitting diode (LED).

14. The method as recited in claim 10, wherein the light emitter is a laser.

15. The method as recited in claim 10, wherein the mapping function is used to determine presence of the wafer before loading the wafer in the end effector.

16. A computer program embedded in a non-transitory computer-readable storage medium, when executed by one or more processors, for detecting presence of a wafer by an end effector, the computer program comprising:
program instructions for generating a light signal by a light emitter;
program instructions for routing the light signal through a single light path around an arm of an end effector, the single light path ending at a light sensor for detecting presence of the light signal, the arm having a first end and a second end, wherein a first point and a second point are defined at the second end, the single light path including a first segment and a second segment, the first segment being defined between the first point and the second point, and the second segment intersecting a wafer when loaded on the end effector;
program instructions for detecting interference with the light signal in a mapping function of a control module when the wafer is between the first point and the second point and the wafer is not loaded on the end effector and the wafer intersects the first segment blocking the light signal from reaching the light sensor;
program instructions for detecting interference with the light signal in a load function of the control module when the wafer is between the first end and the second end and the wafer is loaded on the end effector and the wafer intersects the second segment blocking the light signal from reaching the light sensor; and
program instructions for determining by a control module if an interruption in the single light path corresponds to an interference with the light signal in the mapping function or in the load function, wherein the mapping function determines that a wafer is not properly situated in a horizontal position before loading the wafer in the end effector when the end effector is moving substantially vertically and the mapping function detects interference with the light signal for an amount of time longer than a time corresponding to a sensor properly placed in a horizontal position.

17. The computer program as recited in claim 16, wherein the single light path includes one or more focus lenses.

18. The computer program as recited in claim 16, wherein the single light path includes an optical amplifier.

* * * * *